(12) United States Patent
Lee et al.

(10) Patent No.: US 11,749,767 B2
(45) Date of Patent: Sep. 5, 2023

(54) SOLAR CELL AND METHOD FOR MANUFACTURING THE SAME

(71) Applicant: Korea University Research and Business Foundation, Seoul (KR)

(72) Inventors: Hae-Seok Lee, Seoul (KR); Yoonmook Kang, Seoul (KR); Seungwoo Lee, Seoul (KR); Hoonjoo Choi, Sejong-si (KR); Wonwook Oh, Seoul (KR); Hyeon Ho Kim, Namyangju-si (KR); HyunJung Park, Seoul (KR); Yujin Jung, Seoul (KR); MyeongSeob Sim, Seoul (KR); Dongjin Choi, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/579,137

(22) Filed: Jan. 19, 2022

(65) Prior Publication Data
US 2022/0302330 A1 Sep. 22, 2022

(30) Foreign Application Priority Data
Nov. 25, 2020 (KR) .................. 10-2020-0160167

(51) Int. Cl.
*H01L 31/052* (2014.01)
*H01L 31/0216* (2014.01)
*H01L 31/0224* (2006.01)

(52) U.S. Cl.
CPC ...... *H01L 31/052* (2013.01); *H01L 31/02168* (2013.01); *H01L 31/022425* (2013.01)

(58) Field of Classification Search
CPC ............ H01L 31/052; H01L 31/02168; H01L 31/022425
See application file for complete search history.

(56) References Cited

U.S. PATENT DOCUMENTS

2013/0020491 A1* 1/2013 Mazzillo .................. G01J 1/429
257/434

FOREIGN PATENT DOCUMENTS

| JP | 2012-9523 A | 1/2012 |
|---|---|---|
| KR | 10-2010-0103348 A | 9/2010 |
| KR | 10-2019-0101870 A | 9/2019 |
| KR | 10-2036071 B1 | 10/2019 |
| KR | 10-2020-0061074 A | 6/2020 |

OTHER PUBLICATIONS

Wang et al., "Radiative cooling of commercial silicon solar cells using a pyramid-textured PDMS film", Solar Energy 225 (2021) 245-251.*

(Continued)

*Primary Examiner* — Golam Mowla
(74) *Attorney, Agent, or Firm* — NSIP Law

(57) ABSTRACT

The inventive concept discloses a solar cell and a method for manufacturing the same. The solar cell includes a semiconductor substrate, an emitter layer disposed on one surface of the substrate, and a cooling layer disposed on one surface of the emitter layer, and the cooling layer absorbs a far-infrared ray from irradiated sunlight and emits a wavelength of the absorbed far-infrared ray.

8 Claims, 8 Drawing Sheets

(56) References Cited

OTHER PUBLICATIONS

MacAlpine, Sara M. et al., "Impact of Photovoltaic Module Performance Degradation Rate on LCOE of Utility Scale Systems." *2019 IEEE 46th Photovoltaic Specialists Conference (PVSC)*. IEEE, Jun. 2019, pp. 1368-1371.

Repins, Ingrid et al., "Accelerated Testing for Light and Elevated Temperature Degradation (LeTID) of Purchased Modules" *PV Reliability Workshop—Lakewood, CO*. NREL, Feb. 25, 2021, 10pages.

* cited by examiner

SOLAR CELL AND METHOD FOR MANUFACTURING THE SAME

CROSS-REFERENCE TO RELATED APPLICATIONS

A claim for priority under 35 U.S.C. § 119 is made to Korean Patent Application No. 10-2020-0160167 filed on Nov., 25, 2020, in the Korean Intellectual Property Office, the entire contents of which are hereby incorporated by reference.

STATEMENT REGARDING GOVERNMENT SPONSORED RESEARCH OR DEVELOPMENT

The inventive concept is derived from research conducted as part of new and renewable energy core technology development (R&D) (Project Identification Number: 1415165480, Research Management Institution: Korea Institute of Energy Technology Evaluation and Planning, Research Project Title: Identification and improvement of cause of deterioration of crystalline p-type silicon solar cell and module component based on failure mechanism, Host Institution: Korea University Industry-University Cooperation Foundation, Research Period: 2019 Oct. 1 ~ 2022 Sep. 30, Contribution Rate: ½) of the Ministry of Trade, Industry and Energy.

In addition, the inventive concept is derived from research conducted as part of energy manpower training (R&D) (Project Identification Number: 1415169391, Research Management Institution: Korea Institute of Energy Technology Evaluation and Planning, Research Project Title: Graduate School of Energy-AI Convergence (Solar Energy-AI Convergence Engineering), Host Institution: Korea University Industry-University Cooperation Foundation, Research Period: 2020.05.01 ~ 2022.12.31, Contribution Rate: ½) of the Ministry of Trade, Industry and Energy.

There is no property interest of the Korean government in any aspect of this invention.

BACKGROUND

Embodiments of the inventive concept described herein relate to a solar cell and a method for manufacturing the same.

To respond to a climate change and to respond to a technological progress of the 4th industrial revolution, technologies for eco-friendliness, high efficiency, and safety improvement of energy are needed. Solar power accounts for 50% or more of eco-friendly renewable energy sources for this purpose. In addition, there are movements to increase a supply amount and a power generation amount of the solar power worldwide, such as a domestic renewable energy 3020 policy, an energy policy that increases a proportion of renewable energy generation in overseas advanced countries, and the like.

For mass distribution of the solar power, reduction of levelized cost of electricity (LCOE) is prioritized. As a technical method to reduce the LCOE, it is necessary to develop technologies to reduce maintenance cost through 1) cell efficiency improvement, 2) manufacturing technology innovation, 3) module power generation amount improvement, and 4) deterioration reduction. Among them, the deterioration is an important factor that determines a lifetime and a long-term power generation amount of the solar power. Development of technologies for test, analysis, and improvement of deterioration occurring in a solar cell and a module becomes a main technology development direction.

Light and elevated temperature induced degradation (LeTID), which did not appear in conventional solar power, relates to degradation that occurs under severe conditions of applying light and heat at the same time, and refers to deterioration caused by the light and the heat that the solar cell and the module receive in a real field. To reduce such deterioration, there is a need for a technology for reducing a substrate temperature of the solar cell and the module.

SUMMARY

Embodiments of the inventive concept provide a solar cell and a method for manufacturing the same that may reduce a LeTID phenomenon of the solar cell through a natural radiation cooling effect using a principle that the solar cell absorbs a far-infrared ray during a light irradiation process required for operation and emits a wavelength (from 8 μm to 13 μm) of the absorbed far-infrared ray.

In one example, the technical problems to be achieved in the inventive concept are not limited to the technical problems mentioned above. Other technical problems not mentioned will be clearly understood by those of ordinary skill in the art to which the inventive concept belongs from a following description.

According to an exemplary embodiment, a solar cell includes a semiconductor substrate, an emitter layer disposed on one surface of the substrate, and a cooling layer disposed on one surface of the emitter layer, and the cooling layer absorbs a far-infrared ray from irradiated sunlight and emits a wavelength of the absorbed far-infrared ray.

The cooling layer may contain a PDMS.

A thickness of the cooling layer may be in a range from 5 um to 150 um.

The solar cell may further include an anti-reflection film disposed between the emitter layer and the cooling layer, and a front surface electrode passing through the cooling layer and the anti-reflection film to be connected to the emitter layer.

The cooling layer may further contain a plurality of cooling particles.

According to another exemplary embodiment, a solar cell includes a semiconductor substrate, an emitter layer disposed on one surface of the substrate, and a cooling layer disposed on the other surface of the semiconductor substrate, and the cooling layer absorbs a far-infrared ray from irradiated sunlight and emits a wavelength of the absorbed far-infrared ray.

The cooling layer may contain a PDMS.

A thickness of the cooling layer may be in a range from 5 um to 150 um.

The solar cell may further include an anti-reflection film disposed between the emitter layer and the cooling layer, and a front surface electrode passing through the cooling layer and the anti-reflection film to be connected to the emitter layer.

The cooling layer may further contain a plurality of cooling particles.

According to another exemplary embodiment, a method for manufacturing a solar cell includes disposing an emitter layer on one surface of a semiconductor substrate, and disposing a cooling layer on one surface of the emitter layer or the other surface of the substrate, and the cooling layer absorbs a far-infrared ray from irradiated sunlight and emits a wavelength of the absorbed far-infrared ray.

The cooling layer may contain a PDMS.

A thickness of the cooling layer may be in a range from 5 um to 150 um.

The method may further include directly disposing an anti-reflection film on said one surface of the emitter layer before the disposing of the cooling layer, and disposing a front surface electrode to pass through the cooling layer and the anti-reflection film to be connected to the emitter layer, and the disposing of the cooling layer may include disposing the cooling layer on one surface of the anti-reflection film.

The method may further include directly disposing an anti-reflection film on said one surface of the emitter layer, and disposing a front surface electrode to pass through the anti-reflection film to be connected to the emitter layer, and the disposing of the cooling layer may include disposing the cooling layer on the other surface of the substrate.

The cooling layer may further contain a plurality of cooling particles.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
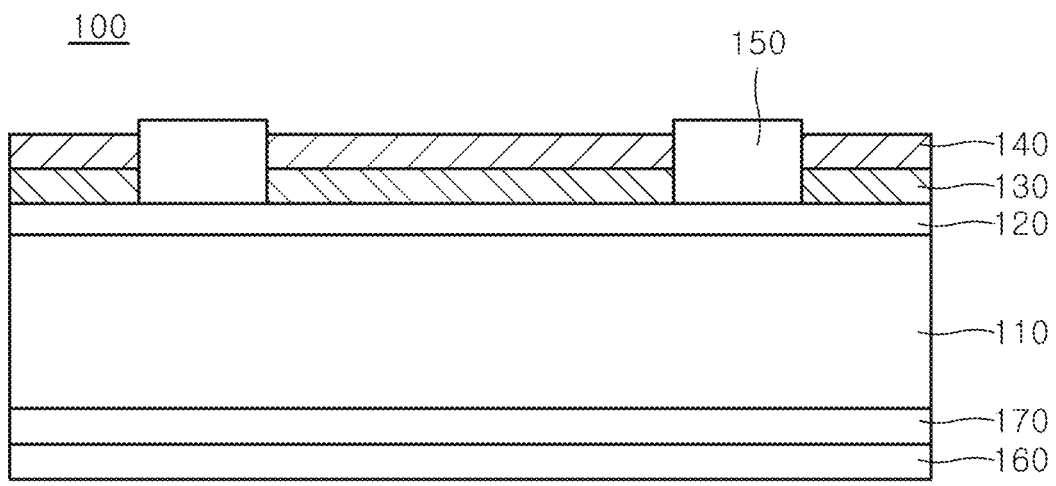
FIG. 1 is a cross-sectional view showing a solar cell according to an embodiment of the inventive concept.
Figure 2:
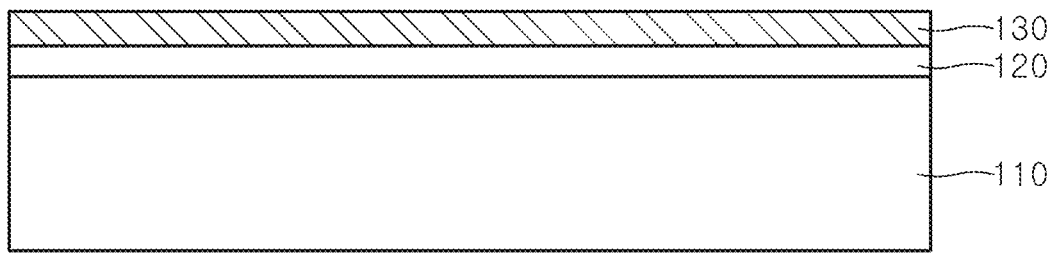
FIGS. 2 to 5 are cross-sectional views for sequentially illustrating a manufacturing process of a solar cell according to an embodiment of the inventive concept.
Figure 3:
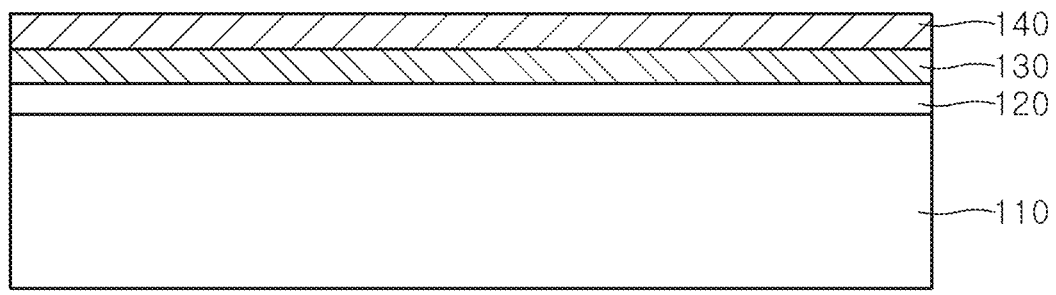
Figure 4:
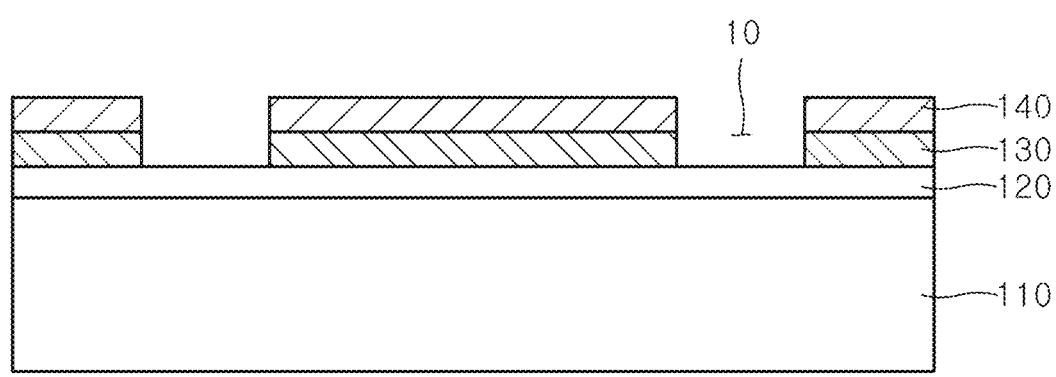
Figure 5:
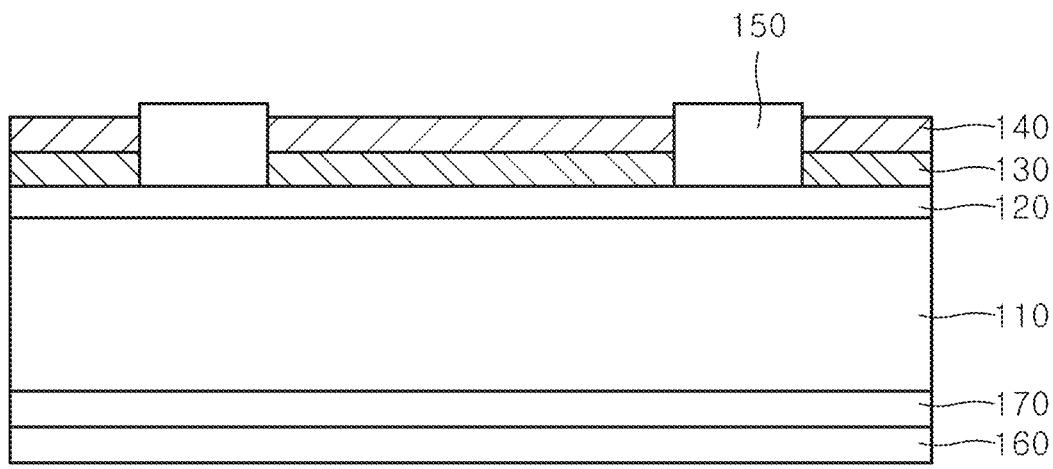

Hereinafter, embodiments of the inventive concept will be described in more detail with reference to the accompanying drawings. The embodiments of the inventive concept may be modified in various forms, and the scope of the inventive concept should not be construed as being limited to the following embodiments. The present embodiment is provided to more completely describe the inventive concept to those of ordinary skill in the art. Accordingly, shapes of elements in the drawings are exaggerated to emphasize a clearer description.

Components of the inventive concept for clarifying solutions to the problems to be solved by the inventive concept will be described in detail with reference to the accompanying drawings based on preferred embodiments of the inventive concept. In assigning reference numerals to the components of the drawings, the same reference numbers are given to the same components even when the components are in different drawings. It should be noted in advance that components of other drawings may be cited when necessary in the description of the corresponding drawing.

FIG. 1 is a cross-sectional view showing a solar cell according to an embodiment of the inventive concept, and FIGS. 2 to 5 are cross-sectional views for sequentially illustrating a manufacturing process of a solar cell according to an embodiment of the inventive concept.

Referring to FIGS. 1 to 5, a solar cell 100 according to an embodiment of the inventive concept will be described.

The solar cell 100 may include a silicon semiconductor substrate 110, an emitter layer 120 on the substrate 110, an anti-reflection film 130 on the emitter layer 120, a cooling layer 140 on the anti-reflection film 130, a front surface electrode 150 passing through the anti-reflection film 130 and the cooling layer 140 to be connected to the emitter layer 120, a rear surface electrode 160, and a rear surface electric field layer 170.

The substrate 110 may be made of silicon, and may be doped with group III elements B, Ga, In, and the like as a P-type impurity to be implemented in a P-type.

The emitter layer 120 may be formed by implanting an N-type impurity into the P-type semiconductor substrate 110.

The emitter layer 120 may be doped with P, As, Sb, and the like, which are group V elements, as the N-type impurity. The emitter layer 120 may be formed by a method such as a diffusion method, a spray method, a printing process method, or the like. For example, the emitter layer 120 may be formed by implanting the N-type impurity into the P-type semiconductor substrate 110.

As such, when the emitter layer 120 and the substrate 110 are doped with impurities of opposite conductivity types, a P-N junction may be formed at an interface between the emitter layer 120 and the substrate 110. When light is irradiated to the P-N junction, photovoltaic power may be generated by a photoelectric effect.

The anti-reflection film 130 may be formed on the emitter layer 120 to reduce a reflectance of sunlight incident on a front surface of the substrate 110, and immobilize a defect present on a surface or in a bulk of the emitter layer 120.

The anti-reflection film 130 may be formed by vacuum deposition, chemical vapor deposition, spin coating, screen printing, or spray coating, but may not be limited thereto.

When the reflectance of the sunlight is reduced, an amount of light reaching the P-N junction is increased, so that a short-circuit current Isc of the solar cell 100 is increased. In addition, when the defect present in the emitter layer 120 is immobilized, a recombination site of minority carriers is removed, so that an open circuit voltage Voc of the solar cell 100 is increased. As such, when the short-circuit current and the open circuit voltage of the solar cell 100 are increased by the anti-reflection film 130, a conversion efficiency of the solar cell 100 may be improved by that much.

For example, such anti-reflection film 130 may have one single film or a multi-film structure in which two or more films selected from a group consisting of a silicon nitride film, a silicon nitride film containing hydrogen, a silicon oxide film, a silicon oxynitride layer, $MgF_2$, $ZnS$, $TiO_2$, and $CeO_2$ are combined with each other.

In one example, although not shown in the drawing, one surface of the substrate 110 onto which the sunlight is incident may have a textured surface. The texturing means forming a pattern of a concavo-convex shape on the surface of the substrate 110. Thus, when the substrate 110 has the textured surface, the emitter layer 120 and the anti-reflection film 130 sequentially positioned on the substrate 110 may also be formed along the textured shape of the one surface of the substrate 110. Accordingly, the reflectance of the incident sunlight may be reduced, thereby reducing an optical loss.

The pattern of the concavo-convex shape may be formed by a process of immersing the substrate 110 in an etchant, laser etching, reactive ion etching, and the like, and the concave-convex shape may have various shapes, such as a pyramid, a square, a triangle, and the like.

The cooling layer 140 may be disposed directly on a top surface of the anti-reflection film 130, and may contain PDMS.

The cooling layer 140 may be formed by the vacuum deposition, the chemical vapor deposition, the spin coating, the screen printing, or the spray coating, but may not be limited thereto. It is preferable to use the spin coating for deposition over a large area.

In one example, the cooling layer 140 is preferably formed to have a thickness in a range from 5 μm to 150 μm. In this connection, when the cooling layer 140 has the thickness smaller than 5 μm, it is not able to cause a cooling effect. When the cooling layer 140 has the thickness greater than 150 μm, because the thickness of the cooling layer 140 is increased more than necessary, light transmittance may be reduced.

In this connection, as the thickness of the cooling layer 140 increases, the cooling effect may be increased, but it is also important that the light enters the solar cell in power generation of the solar cell. Accordingly, as the thickness of the cooling layer increases, the light that enters the solar cell is reduced, so that it is preferable, through a transmittance parameter, that the cooling layer has the thickness of 150 μm.

The cooling layer 140 may absorb a far-infrared ray in the light irradiation process, emit a wavelength (from 8 μm to 13 μm) of the absorbed far-infrared ray, and reduce a LeTID phenomenon of the solar cell 100 through a natural radiative cooling effect of such process.

The front surface electrode 150 may be connected to the emitter layer 120 by passing through the anti-reflection film 130 and the cooling layer 140, and may be formed through a heat treatment process or the like after printing a paste for the front surface electrode 150 containing silver, glass frit, and the like at a position where the front surface electrode 150 is to be formed.

In this connection, reference numeral '10' denotes an etched region 10. The front surface electrode 150 may be formed in the etched region 10.

In this connection, as the silver contained in the paste for the front surface electrode 150 becomes to be in a liquid phase through the heat treatment of the front surface electrode 150 at a high temperature and then recrystallizes into a solid phase again, the front surface electrode 150 is connected to the emitter layer 120 by a fire through phenomenon that penetrates the anti-reflection film 130 via the glass frit.

Although not shown, such front surface electrode 150 may include a finger line and a bus bar electrode electrically connected to the finger line. The finger line may mainly collect electrons generated from the solar cells 100, and the bus bar electrode, which is for attaching a ribbon (not shown) when modularizing the plurality of solar cells 100, may be used to supply the electrons to the outside.

In addition, the solar cell 100 may include a bus bar (not shown) formed on a rear surface of the substrate 110 to be adjacent to the rear surface electrode 160 having the rear surface electric field layer 170 interposed between itself and the substrate 110, and connected to a lead wire (not shown) for the modularization.

The rear surface electrode 160 may be formed by printing a rear surface electrode paste to which aluminum, quartz silica, a binder, and the like are added in a region where the bus bar (not shown) is not formed and then performing the heat treatment on the printed paste. During the heat treatment of the printed rear surface electrode paste, as aluminum, which is a material of the electrode, is diffused through the rear surface of the substrate 110, the rear surface electric field layer 170 may be formed on an interface between the rear surface electrode and the substrate 110.

The rear surface electric field layer 170 may prevent a carrier from moving to the rear surface of the substrate 110 and being recombined. When the recombination of the carrier is prevented, the open circuit voltage may increase, thereby improving an efficiency of the solar cell 100.

Figure 6:
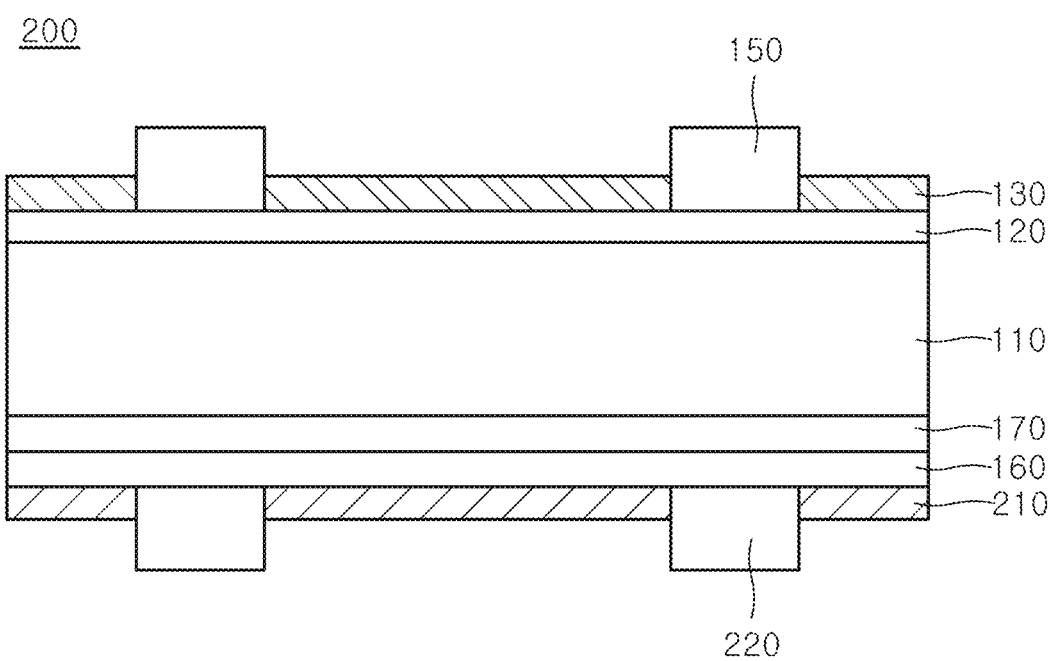
FIG. 6 is a cross-sectional view showing a solar cell according to another embodiment of the inventive concept.
Figure 7:
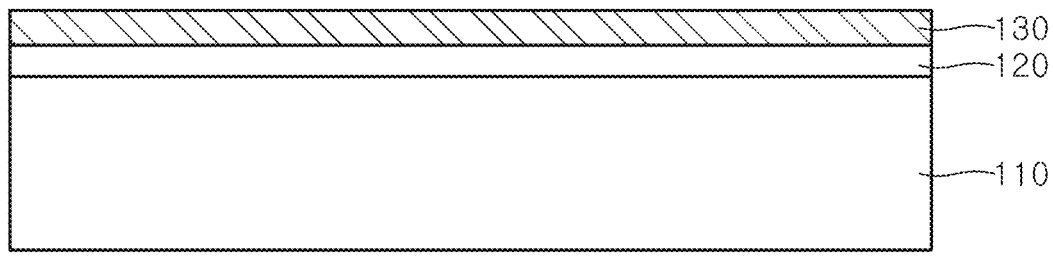
FIGS. 7 to 9 are cross-sectional views for sequentially illustrating a manufacturing process of a solar cell according to another embodiment of the inventive concept.
Figure 8:
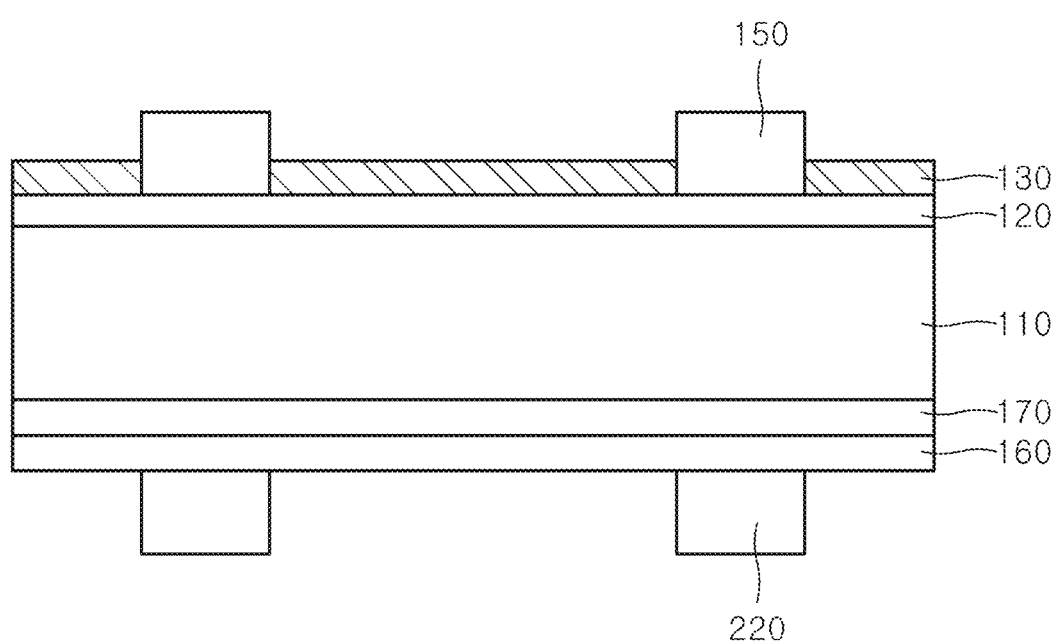
Figure 9:
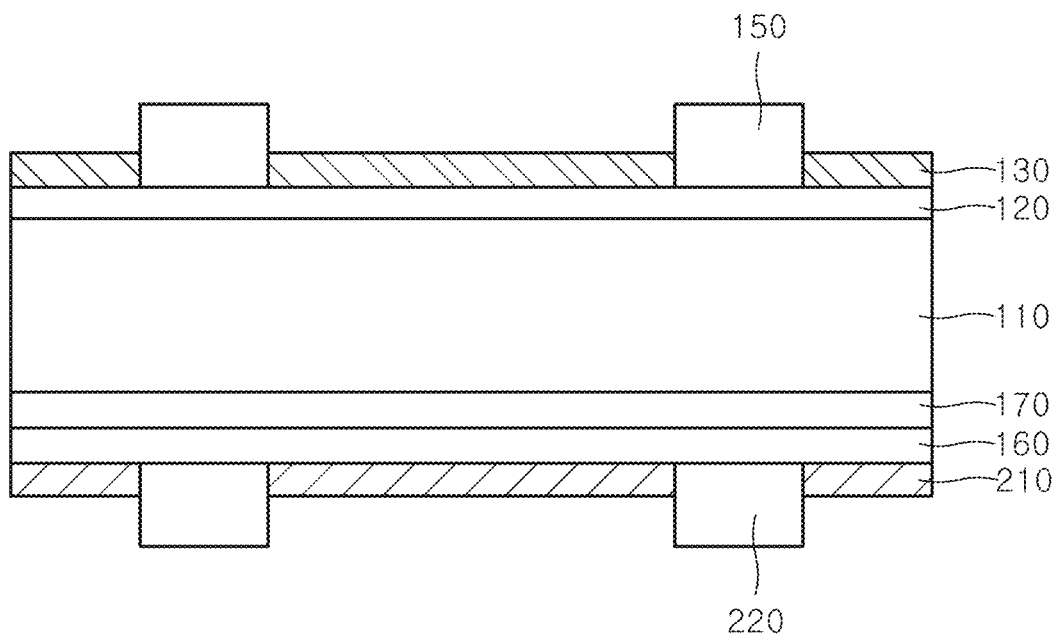

FIG. 6 is a cross-sectional view showing a solar cell according to another embodiment of the inventive concept, and FIGS. 7 to 9 are cross-sectional views for sequentially illustrating a manufacturing process of a solar cell according to another embodiment of the inventive concept.

Hereinafter, a solar cell 200 according to another embodiment of the inventive concept will be described with reference to FIGS. 6 to 9.

The solar cell 200 may include the silicon semiconductor substrate 110, the emitter layer 120 on the substrate 110, the anti-reflection film 130 on the emitter layer 120, the front surface electrode 150 passing through the anti-reflection film 130 to be connected to the emitter layer 120, the rear surface electrode 160, the rear surface electric field layer 170, and a cooling layer 210.

In this connection, the solar cell 200 according to another embodiment of the inventive concept in FIG. 6 has the cooling layer 210, which is different from the solar cell 100 in FIG. 1. Hereinafter, the cooling layer 210 will be described in detail, and a duplicate description of the same component will be omitted.

The cooling layer 210 may be disposed directly on a bottom surface of the rear surface electrode 160 at the other side (a lower side) of the substrate 110, and may contain the PDMS.

The cooling layer 210 may be formed by the vacuum deposition, the chemical vapor deposition, the spin coating, the screen printing, or the spray coating, but may not be limited thereto. It is preferable to use the spin coating for deposition over a large area.

In one example, the cooling layer 210 is preferably formed to have a thickness in a range from 5 μm to 150 μm. In this connection, when the cooling layer 210 has the thickness smaller than 5 μm, it is not able to cause the cooling effect. When the cooling layer 210 has the thickness greater than 150 μm, because the thickness of the cooling layer 210 is increased more than necessary, the light transmittance may be reduced.

The cooling layer 210 may absorb a far-infrared ray from light passing through the solar cell 200, emit a wavelength (from 8 μm to 13 μm) of the absorbed far-infrared ray, and reduce a LeTID phenomenon of the solar cell 200 through a natural radiative cooling effect of such process.

In one example, an external conductive wire 220 may be connected to the rear surface electrode 160 to collect current, and the external conductive wire 220 may pass through the cooling layer 210 to be connected to the rear surface electrode 160.

Figure 10:
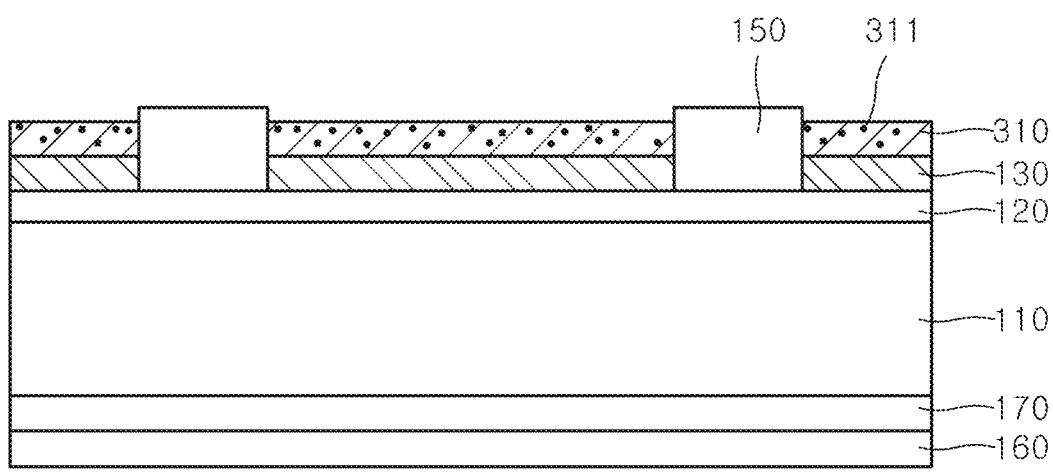
FIG. 10 is a cross-sectional view showing a solar cell according to another embodiment of the inventive concept.

FIG. 10 is a cross-sectional view showing a solar cell according to another embodiment of the inventive concept.

Hereinafter, a solar cell 300 according to another embodiment of the inventive concept will be described with reference to FIG. 10.

The solar cell 300 may include the silicon semiconductor substrate 110, the emitter layer 120 on the substrate 110, the anti-reflection film 130 on the emitter layer 120, a cooling layer 310 on the anti-reflection film 130, the front surface electrode 150 passing through the anti-reflection film 130 and the cooling layer 310 to be connected to the emitter layer 120, the rear surface electrode 160, and the rear surface electric field layer 170.

In this connection, the solar cell 300 according to another embodiment of the inventive concept in FIG. 10 has the cooling layer 310, which is different from the solar cell 100 in FIG. 1. Hereinafter, the cooling layer 310 will be described in detail, and a duplicate description of the same component will be omitted.

The cooling layer 310 may be disposed directly on the top surface of the anti-reflection film 130, and may contain the PDMS. In one example, although not shown, the cooling layer 310 may be disposed on a rear surface of the solar cell 300 as shown in FIG. 6.

The cooling layer 310 may be formed by the vacuum deposition, the chemical vapor deposition, the spin coating, the screen printing, or the spray coating, but may not be limited thereto. It is preferable to use the spin coating for deposition over a large area.

In one example, the cooling layer 310 is preferably formed to have a thickness in a range from 5 µm to 150 µm. In this connection, when the cooling layer 310 has the thickness smaller than 5 µm, it is not able to cause the cooling effect. When the cooling layer 310 has the thickness greater than 150 µm, the thickness of the solar cell 300 may be increased more than necessary.

The cooling layer 310 may absorb a far-infrared ray in the light irradiation process, emit a wavelength (from 8 µm to 13 µm) of the absorbed far-infrared ray, and reduce a LeTID phenomenon of the solar cell 300 through a natural radiative cooling effect of such process.

In one example, the cooling layer 310 may contain a plurality of cooling particles 311 dispersed inside the substrate.

Characteristic Evaluation

Figure 11:
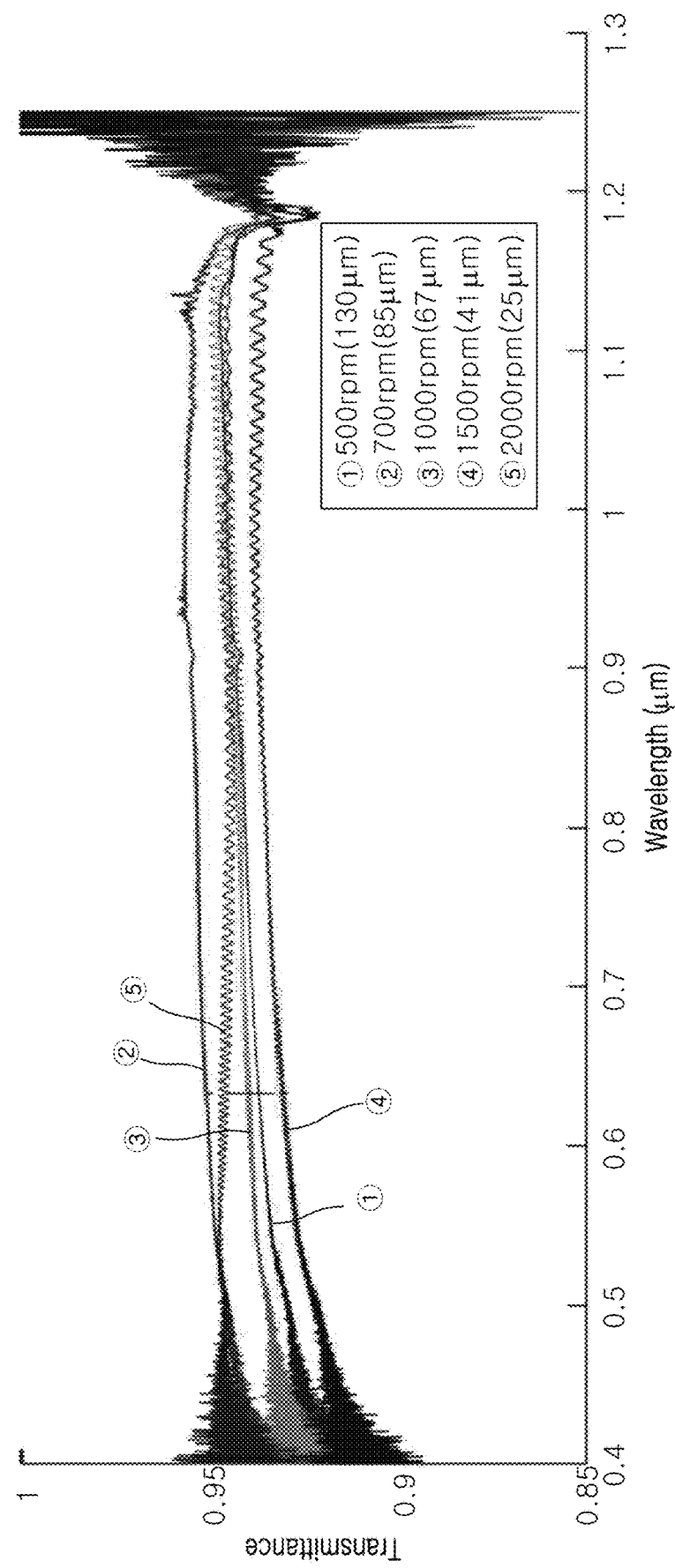
FIGS. 11 to 13 are graphs showing electrochemical characteristics of a solar cell according to an embodiment of the inventive concept.
Figure 12:
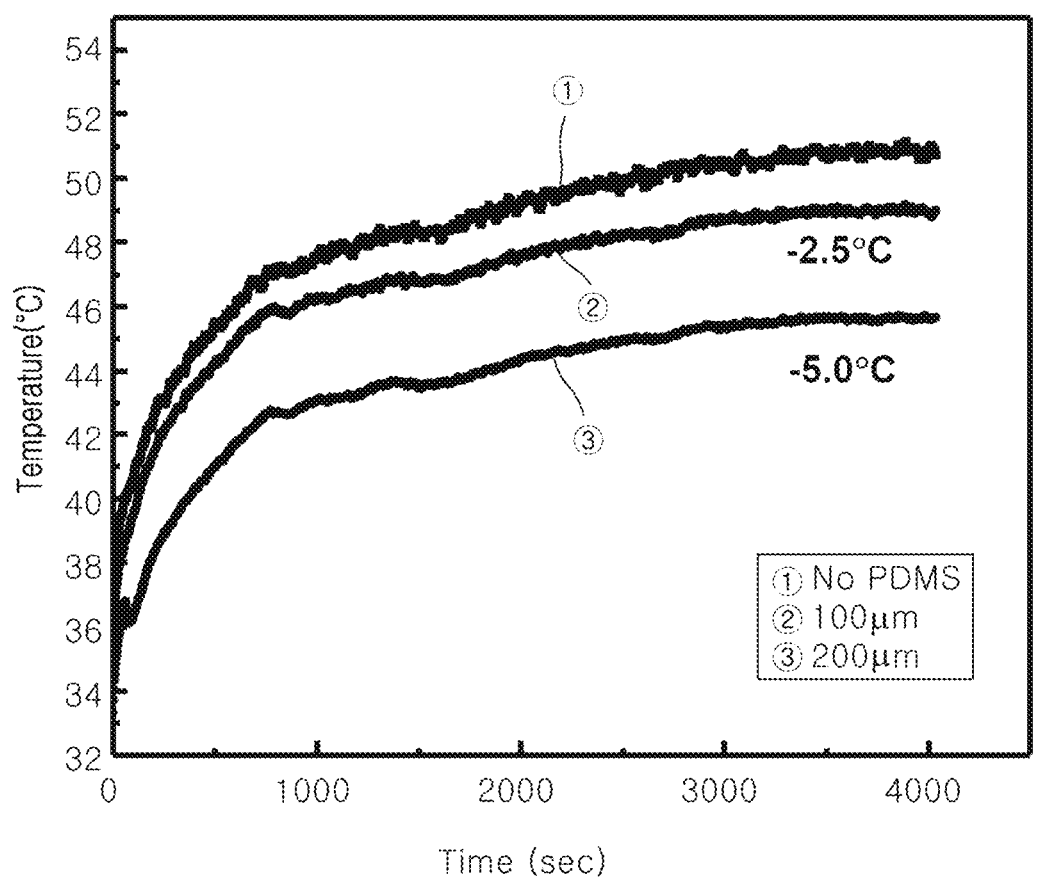
Figure 13:
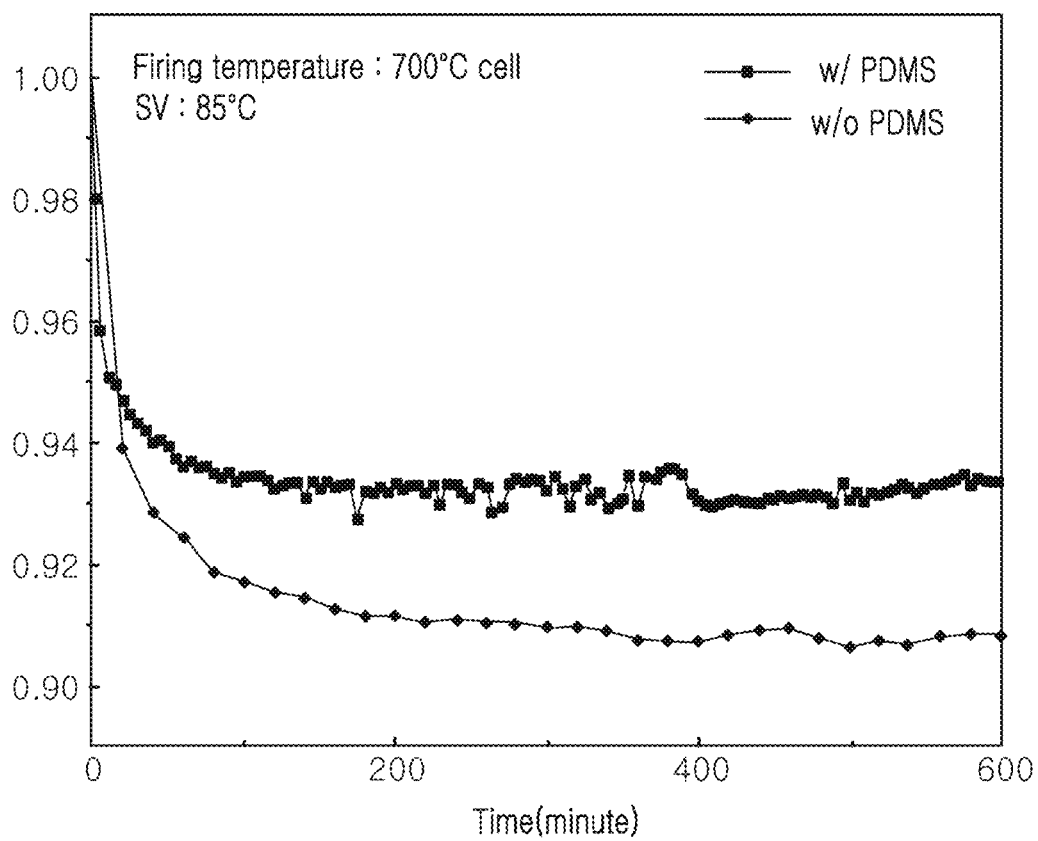

FIGS. 11 to 13 are graphs showing electrochemical characteristics of a solar cell according to an embodiment of the inventive concept.

FIG. 11 shows a transmittance for each thickness of the cooling layer.

Referring to FIG. 11, the transmittance based on the thickness of the cooling layer represents an average value of 93.84% (±0.77). Referring to a following [Table 1], it may be seen that a transmittance of a cooling layer with a thickness of 85 µm is the best.

TABLE 1

| Thickness (µm) | 130 | 85 | 67 | 41 | 25 |
|---|---|---|---|---|---|
| Transmittance (%) (0.4 µm to 1.1 µm) | 93.4 | 94.8 | 93.7 | 92.7 | 94.6 |

In one example, FIG. 11 shows measurement of the transmittance within a wavelength range from 0.4 µm to 1.1 µm performed by depositing the cooling layer having a thickness in a range from 25 µm to 130 µm on the glass using UV-vis equipment. As a result, it was identified that the transmittance of the light required for the solar cell power generation was excellent within the corresponding range, and a light transmittance loss by the cooling layer was not great.

FIG. 12 shows the cooling effect based on the thickness of the cooling layer.

FIG. 12 shows a result of identification of a temperature change resulted from irradiation of light of 1.0 sun (1000 W/m$^2$) in a state in which external light is blocked onto PDMS thin films having thicknesses of 100 µm and 200 µm, respectively, deposited on the solar cell. In a case of a silicon solar cell without the PDMS deposition, it was identified that the temperature increased up to about 50° C. over time. On the other hand, the temperature changes of the solar cells on which the PDMS was deposited were respectively −2.5° C. and −5.0° C., which exhibits that the cooling effect increases as the thickness increases.

Referring to FIG. 12, it may be seen that the solar cell is cooled over an operating time of the solar cell when the cooling layer has the thickness of 100 µm and 200 µm compared to the case of not forming the cooling layer.

In addition, as the cooling layer thickens, an amount of heat radiation received from the sun increases. As a result, radiative heat loss increases, and thus the cooling effect is improved. However, as the thickness increases more than necessary, the light absorption of the solar cell decreases, which may cause a trade-off.

FIG. 13 shows a LeTID graph (an efficiency change graph over time) based on whether the cooling layer exists.

FIG. 13 shows result values obtained by normalizing a light conversion efficiency after performing deterioration in a test environment of 1 sun (1000 w/m$^2$) and 85° C. on 6-inch silicon solar cells with the cooling layer deposited thereon and without the cooling layer.

Referring to FIG. 13, it may be seen that a deterioration rate of the cell on which the cooling layer is deposited was reduced (−9.33% ->−7.04%) more than that of the cell on which the cooling layer is not deposited, indicating that deterioration reduction has appeared. Therefore, it may be expected to reduce deterioration that may occur when the PDMS is applied to an actual solar cell module to generate power in a field.

Referring to FIG. 13, it may be seen that, compared that the deterioration rate is −7.04% over the operating time of the solar cell when the cooling layer is present, the deterioration rate is −9.33% when the cooling layer does not exist.

That is, the inventive concept may form the cooling layer to reduce the LeTID phenomenon of the solar cell through the natural radiation cooling effect using the principle that the solar cell absorbs the far-infrared ray during the light irradiation process required for the operation and emits the wavelength (from 8µm to 13 µm) of the absorbed far-infrared ray. Specifically, the inventive concept may increase a long-term output stability of the solar cell module through an effect such as reducing, using the natural radiative cooling, the LeTID phenomenon of the solar cell, which is a phenomenon in which the temperature of the solar cell increases by the light when the solar cell is installed at an actual site outdoors in a harsh environment to generate electricity as the solar cell absorbs visible light required for driving and produces an output, and the cooling layer on a front surface of the solar cell acts as a coolant during the output of the solar cell through radiative cooling.

The above detailed description exemplifies the inventive concept. In addition, the above-mentioned content is to describe a preferred embodiment of the inventive concept, and the inventive concept is able to be used in various other combinations, modifications, and environments. That is, changes or modifications are possible within the scope of the concept of the inventive concept disclosed herein, the scope equivalent to the written disclosure, and/or within the scope of skill or knowledge in the art. The written embodiment is to describe the best state for implementing the technical idea of the inventive concept, and various changes thereof required in specific application fields and uses of the inventive concept are also possible. Therefore, the above detailed description of the inventive concept is not intended to limit the inventive concept to the disclosed embodiment. The appended claims should also be construed to include other embodiments as well.

According to an embodiment of the inventive concept, it is possible to reduce the LeTID phenomenon of the solar cell through the natural radiation cooling effect using the principle that the solar cell absorbs the far-infrared ray during the light irradiation process required for the operation and emits the wavelength (from 8 µm to 13 µm) of the absorbed far-infrared ray. Specifically, it is possible to increase the long-term output stability of the solar cell module through the effect such as reducing, using the natural radiative cooling, the LeTID phenomenon of the solar cell, which is the phenomenon in which the temperature of the solar cell increases by the light when the solar cell is installed at the actual site outdoors in the harsh environment to generate the electricity as the solar cell absorbs the visible light required for the driving and produces the output, and the cooling layer on the front surface of the solar cell acts as the coolant during the output of the solar cell through the radiative cooling.

In one example, effects that may be obtained from the inventive concept are not limited to the above-mentioned effects. Other effects not mentioned will be clearly understood by those of ordinary skill in the art to which the inventive concept belongs from a following description.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A solar cell comprising:
   a semiconductor substrate;
   an emitter layer disposed on one surface of the semiconductor substrate;
   a planar cooling layer comprising a PDMS and disposed on one surface of the emitter layer;
   an anti-reflection film disposed between the emitter layer and the planar cooling layer; and
   a front surface electrode passing through the planar cooling layer and the anti-reflection film to be connected to the emitter layer,
   wherein the planar cooling layer absorbs a far-infrared ray from irradiated sunlight and emits a wavelength of the absorbed far-infrared ray, and
   wherein a thickness of the planar cooling layer is in a range from 5 µm to 150 µm.

2. The solar cell of claim 1, wherein the planar cooling layer further contains a plurality of cooling particles.

3. A solar cell comprising:
   a semiconductor substrate;
   an emitter layer disposed on one surface of the semiconductor substrate;
   a planar cooling layer comprising a PDMS and disposed on the other surface of the semiconductor substrate,
   an anti-reflection film disposed between the emitter layer and the planar cooling layer; and
   a front surface electrode passing through the planar cooling layer and the anti-reflection film to be connected to the emitter layer,
   wherein the planar cooling layer absorbs a far-infrared ray from irradiated sunlight and emits a wavelength of the absorbed far-infrared ray, and
   wherein a thickness of the planar cooling layer is in a range from 5 µm to 150 µm.

4. The solar cell of claim 3, wherein the planar cooling layer further contains a plurality of cooling particles.

5. A method for manufacturing the solar cell of claim 1, the method comprising:
   disposing an emitter layer on said one surface of the semiconductor substrate;
   directly disposing the anti-reflection film on said one surface of the emitter layer;
   disposing the planar cooling layer on said one surface of the emitter layer;
   disposing the anti-reflection film between the emitter layer and the planar cooling layer; and
   disposing the front surface electrode to pass through the planar cooling layer and the anti-reflection film to be connected to the emitter layer,
   wherein the planar cooling layer absorbs a far-infrared ray from irradiated sunlight and emits a wavelength of the absorbed far-infrared ray, and
   wherein a thickness of the planar cooling layer is in a range from 5 µm to 150 µm.

6. The method of claim 5,
   wherein the disposing of the cooling layer includes:
      disposing the planar cooling layer on one surface of the anti-reflection film.

7. The method of claim 5, further comprising:
   disposing another planar cooling layer on the other surface of the semiconductor substrate.

8. The method of claim 5, wherein the planar cooling layer further contains a plurality of cooling particles.

* * * * *